(12) United States Patent
Ju et al.

(10) Patent No.: US 7,271,981 B2
(45) Date of Patent: Sep. 18, 2007

(54) ULTRAFAST PULSE FIELD SOURCE UTILIZING OPTICALLY INDUCED MAGNETIC TRANSFORMATION

(75) Inventors: Ganping Ju, Wexford, PA (US); Duane Karns, Valencia, PA (US); Thomas F. Ambrose, Sewickley, PA (US); Rene Johannes Marinus van de Veerdonk, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 691 days.

(21) Appl. No.: 10/718,430

(22) Filed: Nov. 20, 2003

(65) Prior Publication Data

US 2005/0111137 A1 May 26, 2005

(51) Int. Cl.
*G11B 5/127* (2006.01)
(52) U.S. Cl. ........................................ 360/125; 360/126
(58) Field of Classification Search ......... 360/125–126
See application file for complete search history.

(56) References Cited

U.S. PATENT DOCUMENTS 6,728,080 B2 * 4/2004 Ito et al. ..................... 360/321

OTHER PUBLICATIONS

J. S. Kouvel et al., "Anomalous Magnetic Moments and Transformations in the Ordered Allow FeRh," *Journal of Applied Physics*, Supplement to vol. 33, No. 3, Mar. 1962, pp. 1343-1344.

J. S. Kouvel, "Unusual Nature of the Abrupt Magnetic Transition in FeRh and Its Pseudobinary Variants," *Journal of Applied Physics*, vol. 37, No. 3, Mar. 1, 1966, pp. 1257-1258.

M. Mansuripur, "The Physical Principles of Magneto-optical Recording," Cambridge, 1995, p. 46.

E. Beaurepaire et al., "Ultrafast Spin Dynamics in Ferromagnetic Nickel," *Physical Review Letters*, vol. 76, No. 22, May 27, 1996, pp. 4250-4253.

W. K. Hiebert et al., "Direct Observation of Magnetic Relaxation in a Small Permalloy Disk by Time-Resolved Scanning Kerr Microscopy," *Physical Review Letters*, vol. 79, No. 6, Aug. 11, 1997, pp. 1134-1137.

(Continued)

*Primary Examiner*—A. J. Heinz
(74) *Attorney, Agent, or Firm*—Robert P. Lenart, Esq.; Pietragallo Bosick & Gordon, LLP

(57) ABSTRACT

A magnetic field transducer includes a phase transition material exhibiting a change from an antiferromagnetic phase to a ferromagnetic phase when heated above a critical temperature, means for applying a magnetic bias field to the phase transition material, and means for heating the phase transition material above the critical temperature. Magnetic recording heads that include the transducer and magnetic disc drives that include the magnetic recording heads are also described. A method of producing a magnetic field pulse including applying a magnetic bias field to a phase transition material, and heating the phase transition material to cause the phase transition material to change from an antiferromagnetic phase to a ferromagnetic phase, is also provided. The phase transition material can comprise a rare earth-transition metal alloy, where the alloy is heated above a compensation temperature.

23 Claims, 4 Drawing Sheets

OTHER PUBLICATIONS

G. Ju et al., "Ultrafast Nonequilibrium Spin Dynamics in a Ferromagnetic Thin Film," *Physical Review B*, vol. 57, No. 2, Jan. 1, 1998, pp. R700-R703.

E. Beaurepaire et al., "Spin Dynamics in $CoPt_3$ Alloy Films: A Magnetic Phase Transition in the Femtosecond Time Scale," *Physical Review B*, vol. 58, No. 18, Nov. 1, 1998, pp. 12 134-12 137.

C. H. Back et al., "Minimum Field Strength in Precessional Magnetization Reversal," *Science*, vol. 285, Aug. 6, 1999, pp. 864-867.

Y. Acremann et al., "Ultrafast Generation of Magnetic Fields in a Schottky Diode," *Nature*, vol. 414, Issue 6859, Nov. 2001, pp. 52-54.

J.-U. Thiele et al., "FeRh/FePt Exchange Spring Films for Thermally Assisted Magnetic Recording Media," *Applied Physics Letters*, vol. 82, No. 17, Apr. 28, 2003, pp. 2859-2861.

\* cited by examiner

ULTRAFAST PULSE FIELD SOURCE UTILIZING OPTICALLY INDUCED MAGNETIC TRANSFORMATION

FIELD OF THE INVENTION

This invention relates to transducers for producing magnetic fields, and more particularly to such transducers that can be used to produce magnetic field pulses.

BACKGROUND OF THE INVENTION

With the rapid increase of areal density and data rate for magnetic recording systems, the examination of high frequency switching dynamics of the recording medium becomes even more important. However, one of the biggest challenges is the lack of an ultrafast magnetic field pulse source with a large amplitude (>1 Tesla) and short rise-time (<100 ps). Conventional recording heads capable of generating large fields are typically limited by the precession frequency of the magnetization direction in the write pole, even when driven by a waveguide. Other options like high bandwidth co-planar waveguides have difficulty generating a large amplitude pulse field. Optical pulse excitation of a Schottky barrier can deliver an ultrafast pulse, but the amplitude is well below 1 kOe. The Stanford Linear Accelerator can also deliver such short pulse fields with large amplitudes, but it cost millions of dollars.

It has been shown that the magnetization of ferromagnetic (FM) thin films can be modulated on a sub-picosecond timescale by photoexciting the electron spins away from their equilibrium position with the lattice, thereby creating an non-equilibrium condition such that $T_e >> T_1$ and $T_s >> T_1$, where $T_e$, $T_s$ and $T_1$ are temperatures defined in terms of a three-temperature model, specifically designated for the sub-system of electron, spin and lattice degrees of freedom of the spin-polarized magnetic systems. However the application of fast heat pulses on such ordinary ferromagnetic material can only result in a demagnetizing field, where the photoexcitation terminates the fringing field for a short period.

There is a need for a transducer that can provide fast magnetic field pulses at a magnetic field strength that would be useful in practical devices.

SUMMARY OF THE INVENTION

The magnetic field transducers of this invention include a phase transition material exhibiting a change from an antiferromagnetic phase to a ferromagnetic phase when heated above a critical temperature, means for applying a magnetic bias field to the phase transition material, and means for heating the phase transition material above the critical temperature.

The phase transition material can be selected from a group consisting of: FeRh, and FeRhX, where X is one of Pd, Pt, Ir, Ru, Re or Os. Alternatively, the phase transition material can include a rare earth/transition metal alloy.

The bias field can be applied by using one or more conductors, positioned near the phase transition material.

The means for heating the phase transition material above the critical temperature can include a source of electromagnetic radiation, and means for directing electromagnetic radiation from the source onto the phase transition material.

In another aspect, the invention encompasses a magnetic recording head including a write pole including the transducer.

The invention further encompasses a disc drive comprising means for supporting a storage medium, a magnetic recording head including the transducer, and means for positioning the magnetic recording head adjacent to the storage medium.

The invention also encompasses a method of producing a magnetic pulse, the method comprising: providing a phase transition material; applying a magnetic bias field to the phase transition material; and heating the phase transition material to cause the phase transition material to change from an antiferromagnetic phase to a ferromagnetic phase.

In another aspect, the invention encompasses a method of recording data in a storage medium, the method comprising: placing a phase transition material adjacent to a surface of the storage medium; applying a magnetic bias field to the phase transition material; heating the phase transition material to cause the phase transition material to change from an antiferromagnetic phase to a ferromagnetic phase, thereby producing a magnetic pulse; and using the magnetic pulse to affect the magnetization of the storage medium.

DETAILED DESCRIPTION OF THE INVENTION

This invention provides an ultrafast pulse magnetic field transducer utilizing an antiferromagnetic-to-ferromagnetic (AFM-FM) transition on an ultrashort time scale. The antiferromagnetic-to-ferromagnetic transition can be optically induced. Magnetic materials such as, FeRh or FeRhX (where X can be a transition metal, such as Pd, Pt, Ir, Ru, Re or Os, etc.), are antiferromagnetic at room temperature, and become ferromagnetic when heated above a critical temperature $T_N$. For the purposes of this description, these materials are referred to as phase transition materials. The transducers of this invention apply an ultrashort heat pulse to the phase transition material to generate an ultrafast fringing field. The heat pulse can be applied for a brief time period of for example <$10^{-10}$ sec. Electromagnetic radiation such as visible, ultraviolet or infrared light can be directed onto the phase transition material to provide the heat pulse. One example of the transducer includes an open gap in the phase transition material, similar to the gap used in a longitudinal magnetic recording head.

Figure 1:
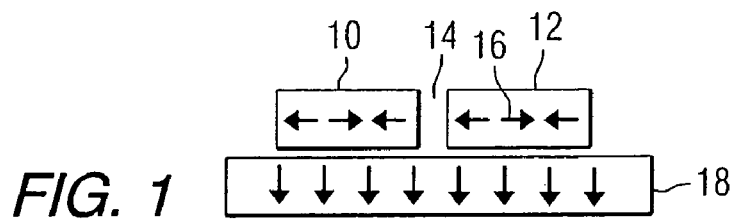
FIG. 1 is a schematic representation of a phase transition material structure that can be used in a transducer constructed in accordance with this invention.

FIG. 1 is a schematic representation of a phase transition material structure that can be used in a transducer constructed in accordance with this invention. The transducer includes first and second segments of phase transition material 10 and 12 separated by a gap 14. The segments are made of a phase transition material that undergoes a transition from an antiferromagnetic phase to a ferromagnetic phase when the material is heated beyond a critical temperature $T_N$. The material in this example is antiferromagnetic at room temperature with internal magnetic domains oriented in different directions as indicated by arrows 16. Therefore, there is no magnetic field in the gap. The segments 10 and 12 can be positioned adjacent to a magnetic storage medium 18. Upon the application of ultrashort optical pulses having a duration of for example $10^{-13}$ to $10^{-10}$ sec, the magnetic material is heated above a critical temperature and becomes ferromagnetic. Then the transducer magnetization aligns with a bias magnetic field, resulting in an ultrashort fringing field in the transducer gap that can be used to switch the magnetization of the storage medium.

When the magnetization of the segments is aligned, a north and a south pole (magnetic dipole charge) are formed at either side of the transducer gap edges, and magnetic flux flows through the gap producing the magnetic field. The transient heating of the transducer above the phase transition temperature induces the magnetic alignment in a very short time, and the magnetic alignment is terminated when the material is cooled below the transition temperature, resulting in a field pulse. While the directions of magnetization of the storage medium 18 in FIG. 1 are shown as being aligned vertically, it should be understood that this invention can be applied to both longitudinal and perpendicular media as the magnetic fields contain both in-plane and perpendicular components.

Figure 2:
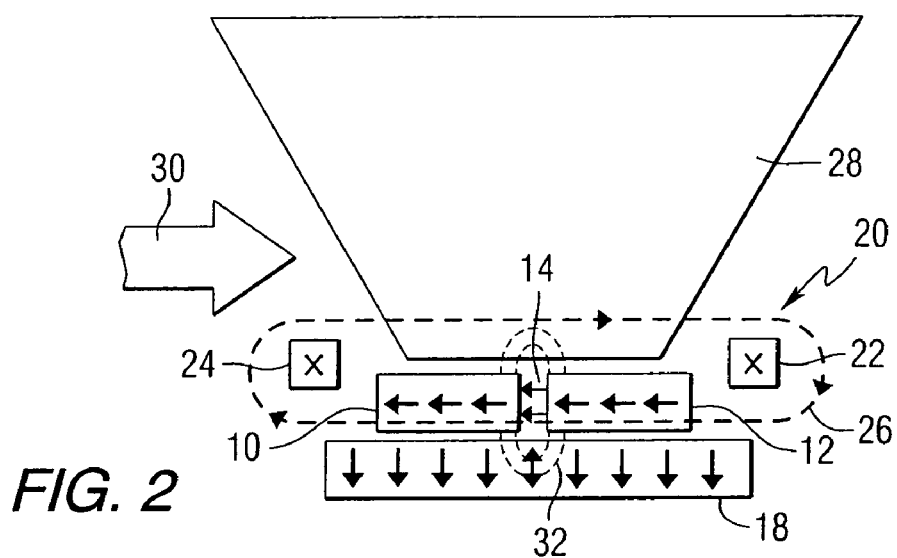
FIG. 2 is a schematic representation of a transducer including the structure of FIG. 1.

FIG. 2 is a schematic representation of a transducer 20 that includes the structure of FIG. 1. A means for magnetically biasing the structure is shown in the form of conductors 22 and 24. An electric current flowing in the conductors produces a bias field indicated by line 26. A means for heating the structure is provided in the form of a waveguide 28 that is mounted to receive an electromagnetic wave, such as visible, ultraviolet or infrared light indicated by arrow 30. The waveguide directs the electromagnetic wave onto the structure. When the structure is heated with ultrashort optical pulses (or other means for generating heat pulses), a phase transition from AFM to FM takes place, and the magnetization of the phase transition material becomes aligned with the bias field. This results in a pulsed fringing field 32 in the vicinity of the gap 14. The fringing field can be used to affect the magnetization of the storage medium.

The phase transition material can be FeRh. During the phase transition, FeRh undergoes an isotropic lattice expansion that sets the time scale of the pulse field. Many pump-probe experiments have shown that a lattice expansion can take place on a picosecond time scale when the material is excited with a short heat pulse. The transducers of this invention can be incorporated into the writer of a magnetic recording head. The write speed of magnetic recording heads has been limited by the ferromagnetic resonance of the material used for the write pole. Recording heads that include writers using the transducers of this invention are not limited by the ferromagnetic resonance, but by the AFM-FM phase transition, which can take place on a significantly shorter timescale.

Another important aspect is the amplitude of a pulse magnetic field produced by the transducer. The typical magnetic saturation value, $M_S$, of FeRh is around 1300 emu/cc, corresponding to a magnetic field strength, $B_S$, of about 1.63 Tesla, which is smaller than the highest $B_S$ materials available (~2.4-2.5 Tesla). With optimal design of the field delivery with such a phase transition material, a pulse field with an amplitude of up to 1 Tesla, and a pulse width as short as a few tens of picoseconds is certainly feasible. The field direction can be easily set with an externally applied bias field from a wire or waveguide.

Figure 3:
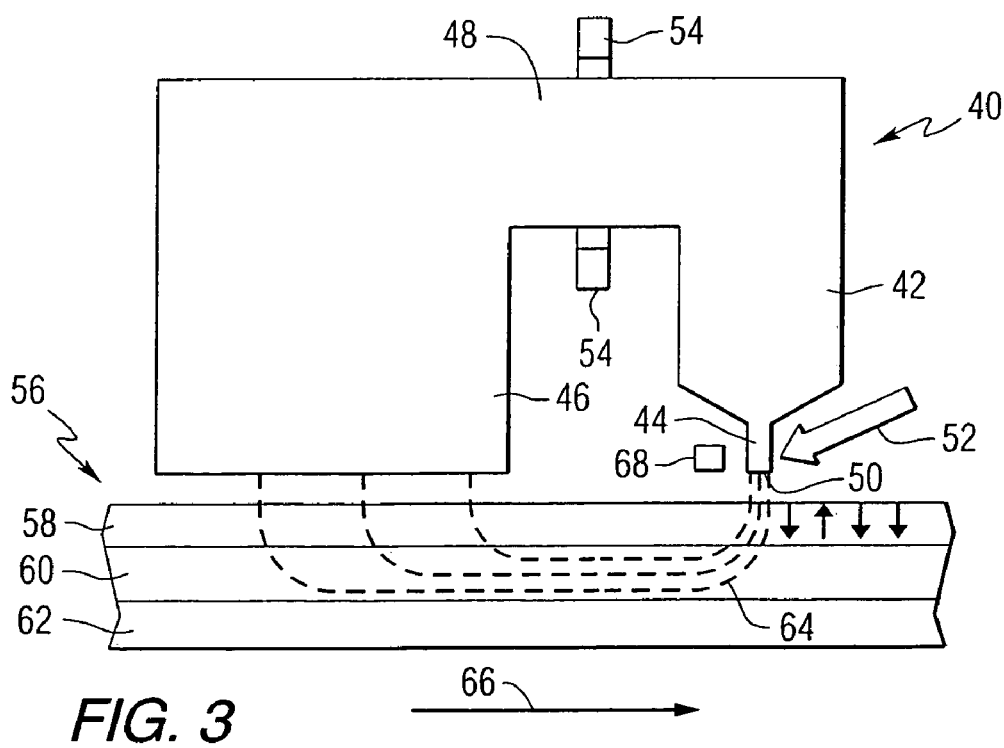
FIG. 3 is a schematic representation of a magnetic recording head including another transducer constructed in accordance with this invention.

FIG. 3 is a schematic representation of a perpendicular magnetic recording head 40 that includes a transducer constructed in accordance with this invention. The recording head includes a write pole 42 that includes a phase transition material 44 that is magnetically coupled to a return pole 46 by a yoke 48. One end of the phase transition material is positioned adjacent to an air bearing surface 50 of the recording head. Means for heating the phase transition material in the form of a light beam is shown by arrow 52. When the phase transition material is illuminated by the light, the temperature of the phase transition material rises above a critical temperature at which point the phase transition material changes from an antiferromagnetic phase to a ferromagnetic phase, and the magnetic moments of the domains within the phase transition material becomes aligned with a bias field. A means 54 for providing the bias magnetic field, in the form of a coil, can be included to control the direction of the magnetic field when the phase transition material changes from an antiferromagnetic phase to a ferromagnetic phase. The head can also include other well-known structures such as a read element. Alternatively, a transmission line 68 can be located near the pole tip and an electric current flowing in the transmission line can be used to provide the bias magnetic field.

The recording head can be positioned adjacent to a magnetic recording medium 56 that includes a magnetically hard recording layer 58 and a magnetically soft underlayer 60 supported by a substrate 62. When the phase transition material changes from an antiferromagnetic phase to a ferromagnetic phase, a magnetic field pulse illustrated by lines 64 is created. This magnetic field pulse can be used to affect the magnetization of the recording layer 58 as the recording medium moves relative to the recording head in the direction indicated by arrow 66.

Figure 4:
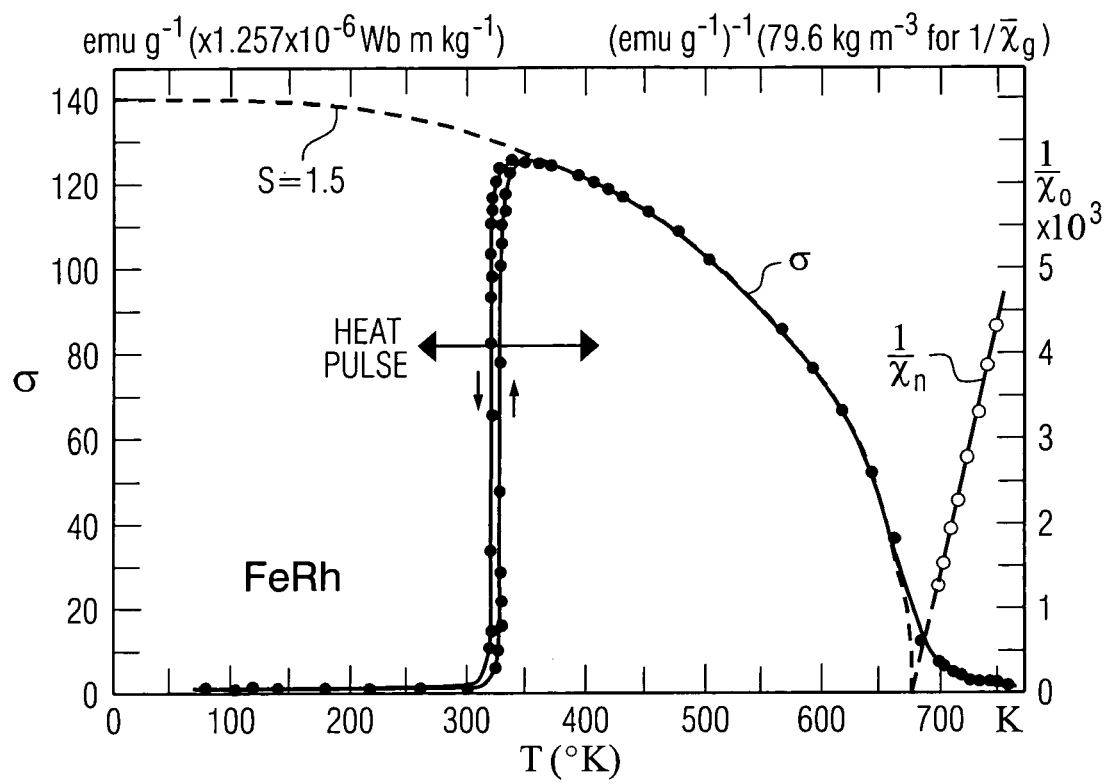
FIGS. 4, 5, 6 and 7 are graphs that illustrate the operation of the invention.
Figure 5:
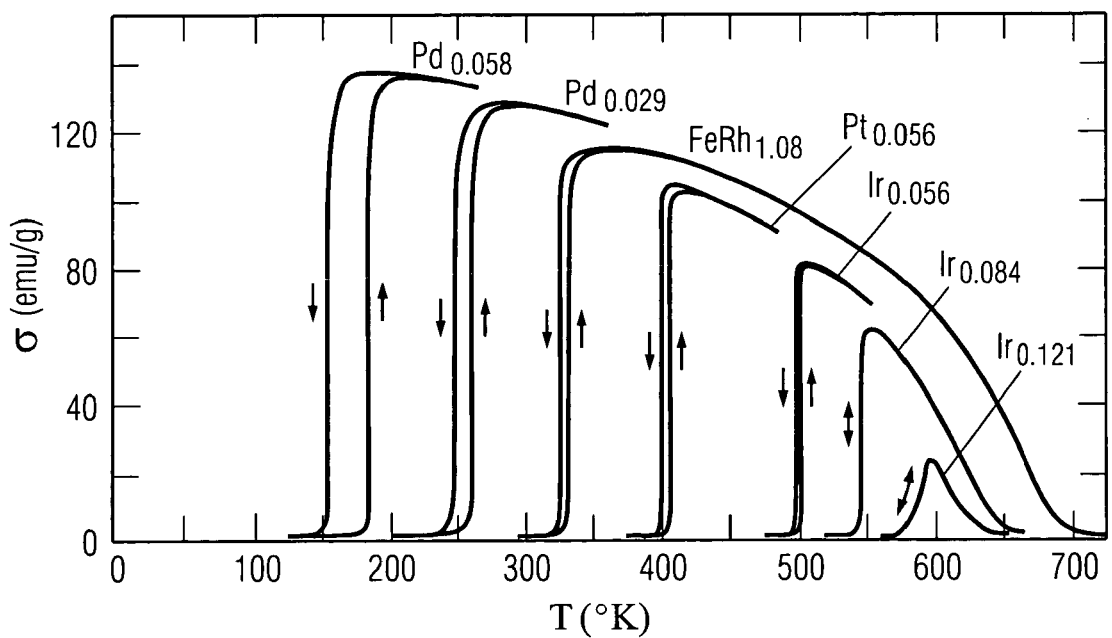

FIGS. 4 and 5 are graphs of previously existing data that further illustrate the mechanism of generating an ultrashort pulse field source using an optically (or thermally) induced AFM-FM phase transition. FIG. 4 is a graph from J. S Kouvel and C. C. Hartelius, J. Appl. Phys. 33, 1343 (1962), showing the magnetic saturation versus temperature for FeRh. FIG. 5 is a graph from J. S. Kouvel, J. Appl. Phys. 37, 1257 (1966), showing that the phase transition temperature can be tuned with a small addition of Pt and Ir.

Figure 6:
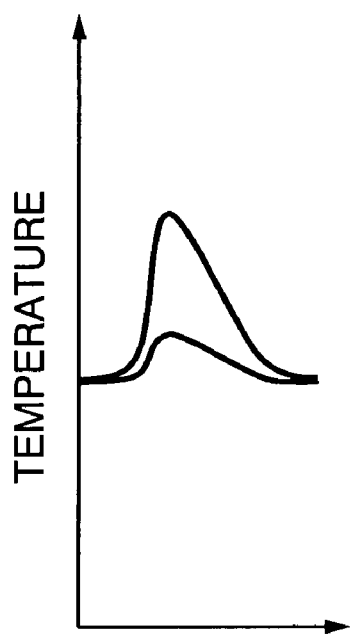
Figure 7:
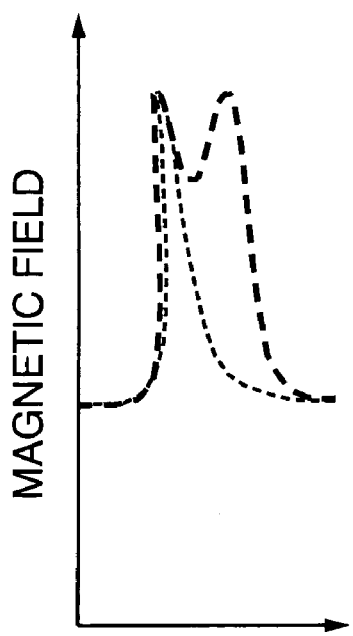

FIG. 6 is a graph showing a heat pulse profile with rise time around 1-10 ps, and a fall time of 10-100 ps, when the phase transition material is excited with short optical pulses. The maximum heating temperature largely depends on the excitation level, i.e., the energy density focused onto the phase transition material. FIG. 7 illustrates that the pulse field temporal profile largely depends on the maximum temperature. When the material is just above the phase transition temperature, an impulse type of pulse field can be achieved, while a further increase of the heat-up temperature results in a square pulse field with a small overshoot. This can be simply understood from a projection of the magnetization over the time-evolving temperature.

Figure 8:
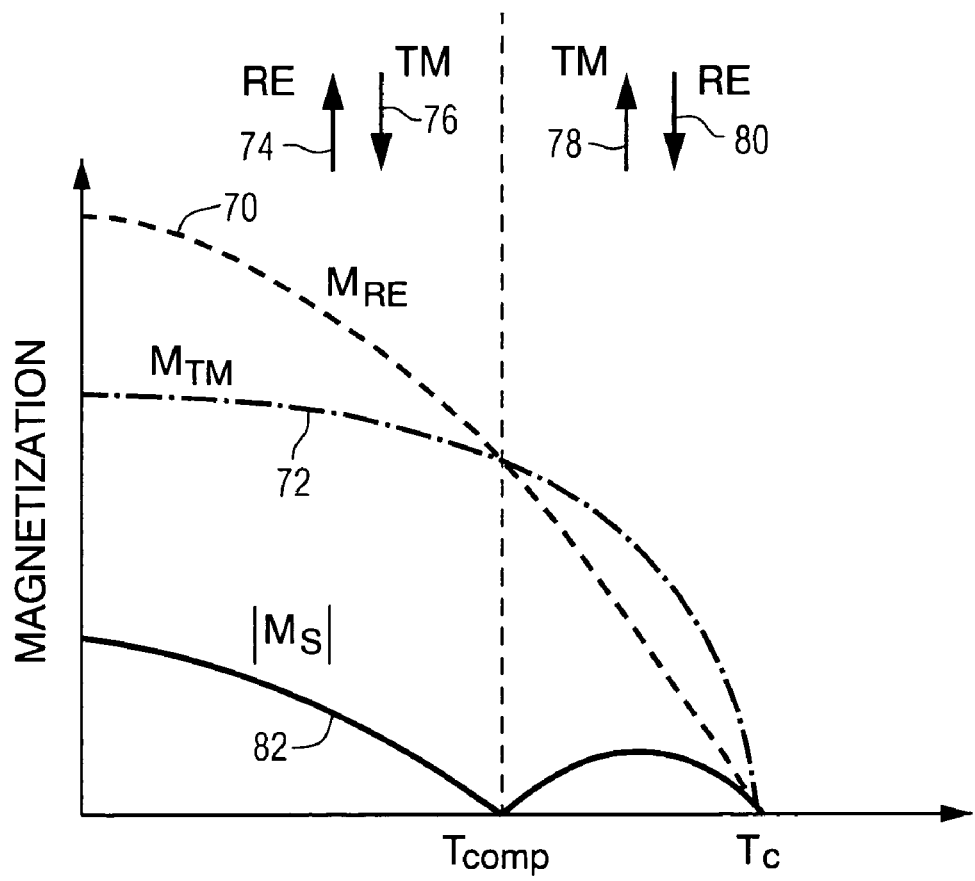
FIG. 8 is a graph showing the temperature dependence of the net magnetization in rare earth/transition metal materials.

Another class of material that can be utilized in the transducers of this invention includes rare earth/transition metal (RE-TM) materials, which are compensated (with zero net moment) at around room temperature. When heated, a finite net moment is produced due to a different temperature dependence of $M_S$ for the RE and TM components as shown in FIG. 8. This temperature dependence can be used to generate an ultrashort pulse field, however the field amplitudes may be smaller than those in the FeRhX types of material, due to the smaller net magnetization.

FIG. 8 is a graph from M. Mansuripur, "The Physical Principles of Magneto-optical Recording", Cambridge (1995) page 46, showing the temperature dependence of the net magnetization in rare earth/transition metal materials. Line 70 represents the magnetization of a rare earth element and line 72 represents the magnetization of a transition metal. The magnetic moments of the rare earth element and the transition metals are oriented in opposite directions as illustrated by arrows 74, 76, 78 and 80. Line 82 represents the magnetization of the RE-TM alloy. At the compensation temperature, $T_{comp}$, the magnetization is zero. As the temperature of the material is heated above $T_{comp}$, the magnetization increases. This increase in magnetization can be used in the transducers described above to produce the desired magnetic field pulse. The magnitude of the magnetic field pulse produced by heating a RE-TM alloy would be lower than the magnitude of a magnetic field pulse produced by heating a FeRh or FeRhX alloy.

RE-TM alloys typically do not need to be annealed to achieve the desired phase with the appropriate room temperature magnetic properties. On the other hand, for FeRh a high temperature anneal is required to obtain an ordered alloy phase that is antiferromagnetic at room temperature. Therefore using the RE-TM alloy may make the manufacturing process easier. Examples of combinations of rare earth elements and transition metal alloys that could be used as the phase transition material include TbFeCo and TbFeCoPt.

Figure 9:
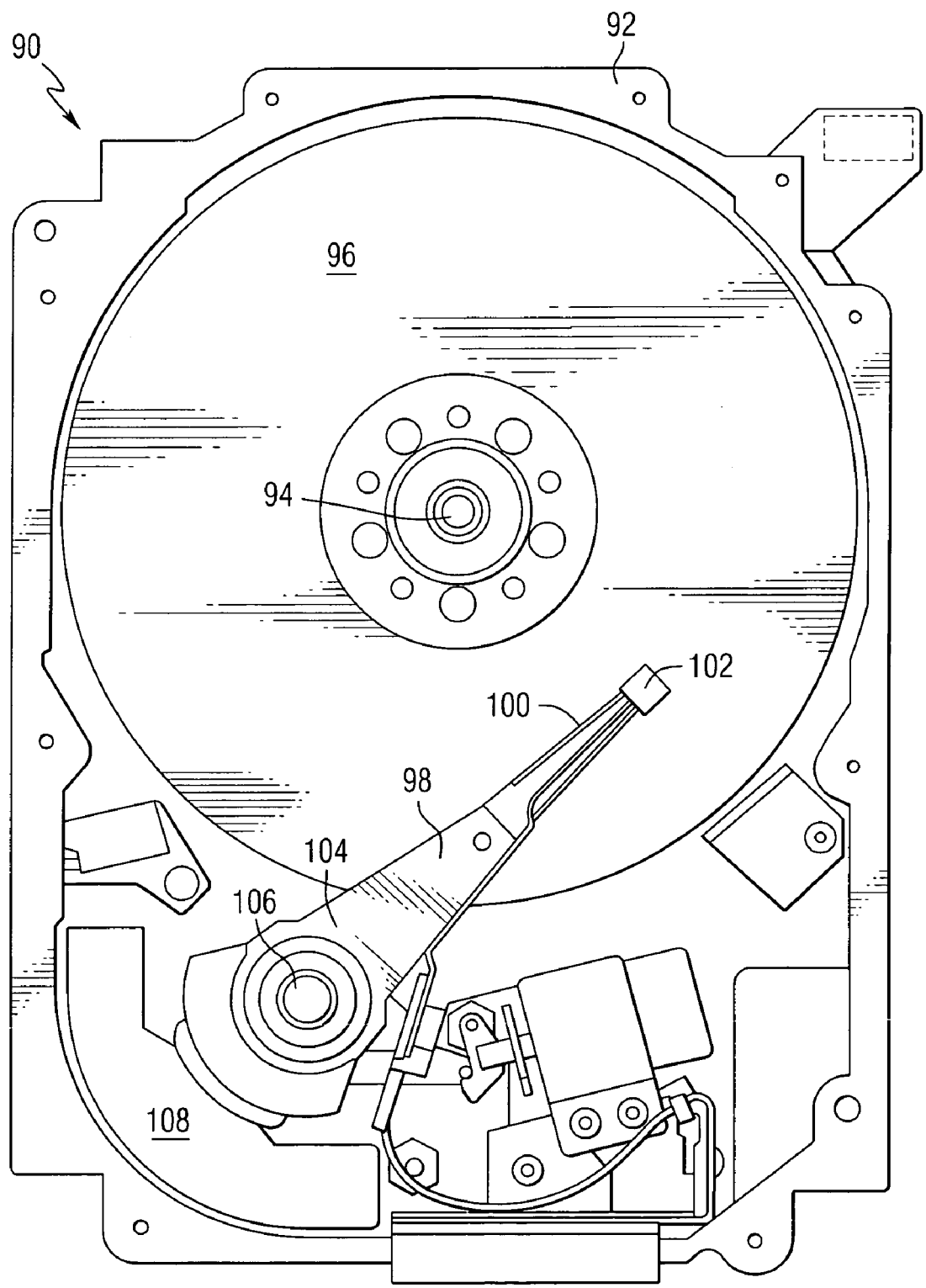
FIG. 9 is a schematic representation of a disc drive that can include the transducers of this invention.

This invention also encompasses disc drives used for magnetic recording that include at least one of the transducers described above. FIG. 9 is a pictorial representation of a disc drive 90 constructed in accordance with this invention. The disc drive includes a housing 92 (with the upper portion removed and the lower portion visible in this view) sized and configured to contain the various components of the disc drive. The disc drive includes a spindle motor 94 for rotating at least one data storage medium 96 within the housing, in this case a magnetic disc. At least one arm 98 is contained within the housing 92, with each arm 98 having a first end 100 with a recording head or slider 102, and a second end 104 pivotally mounted on a shaft by a bearing 106. An actuator motor 108 is located at the arm's second end 104, for pivoting the arm 98 to position the head 102 over a desired sector of the disc 96. The actuator motor 108 is regulated by a controller that is not shown in this view and is well-known in the art.

In heat assisted magnetic recording, the transducer can be used to heat a portion of the storage medium and the heated portion of the storage medium can be subjected to a magnetic field to affect the magnetization of a storage layer in the storage medium. Integration of the ultrafast transducers of this invention with heat assisted magnetic recording writer is feasible as both light delivery and field delivery can be controlled by the optics, which can be co-located.

The transducers of this invention may be used in any application where an ultrafast magnetic field source is needed. Such applications include Magnetic Random Access Memory (MRAM) devices, magneto-optical recording, or apparatus used in the study of ultra-high frequency switching dynamics.

While the invention has been described in terms of several examples, it will be apparent to those skilled in the art that various changes can be made to the disclosed examples, without departing from the scope of the invention as set forth in the following claims.

What is claimed is:

1. A magnetic field transducer comprising:
    a phase transition material exhibiting a change from an antiferromagnetic phase to a ferromagnetic phase when heated above a critical temperature;
    a magnetic field source for applying a magnetic bias field to the phase transition material; and
    a heat source for heating the phase transition material above the critical temperature;
    wherein the phase transition material comprises a first section and a second section, and wherein the first section and the second section are separated to form a gap.

2. The magnetic field transducer of claim 1, wherein the phase transition material is selected from a group consisting of: FeRh, and FeRhX, where X is one of Pd, Pt, Ir, Ru, Re or Os.

3. The magnetic field transducer of claim 1, wherein the phase transition material comprises a rare earth/transition metal alloy.

4. A disc drive comprising:
    a motor for supporting a storage medium;
    the magnetic recording head of claim 1; and
    an arm for positioning the magnetic recording head adjacent to the storage medium.

5. The magnetic field transducer of claim 1, wherein the magnetic field source comprises:
    a conductor for applying the magnetic bias field to the phase transition material.

6. The magnetic field transducer of claim 1, wherein the heat source comprises:
    a source of electromagnetic radiation; and
    a waveguide for directing electromagnetic radiation from the source onto the phase transition material.

7. A magnetic recording head including a write pole comprising the transducer of claim 1.

8. A method of producing a magnetic pulse, the method comprising:
    providing a phase transition material, wherein the phase transition material comprises a first section and a second section, and wherein the first section and the second section are separated to form a gap;
    applying a magnetic bias field to the phase transition material; and
    heating the phase transition material to cause the phase transition material to change from an antiferromagnetic phase to a ferromagnetic phase, thereby producing a magnetic pulse.

9. The method of claim 8, wherein the step of heating the phase transition material comprises:
    directing an electromagnetic wave onto the phase transition material.

10. The method of claim 8, wherein the phase transition material comprises FeRh or FeRhX, wherein X is selected from the group of Pd, Pt, Ir, Ru, Re or Os.

11. The method of claim 8, wherein the phase transition material comprises a rare earth/transition metal alloy.

12. The method of claim 8, wherein the step of applying a magnetic bias field to the phase transition material comprises:
    passing an electric current through a conductor to apply the magnetic bias field to the phase transition material.

13. A recording head for use with a data in a storage medium, the recording head comprising:
    a write pole including a phase transition material;
    a return pole magnetically coupled to the write pole;

a transmission line positioned adjacent to the phase transition material, wherein current flowing in the transmission line applies a magnetic bias field to the phase transition material; and a heat source for heating the phase transition material;

wherein the phase transition material comprises FeRh or FeRhX, wherein X is selected from the group of Pd, Pt, Jr. Ru, Re or Os.

14. The recording head of claim 13, wherein the write pole includes a tapered portion connected to the phase transition material portion.

15. A method of recording data in a storage medium, the method comprising:

placing a phase transition material adjacent to a surface of the storage medium, wherein the phase transition material comprises a first section and a second section, and wherein the first section and the second section are separated to form a gap;

applying a magnetic bias field to the phase transition material;

heating the phase transition material to cause the phase transition material to change from an antiferromagnetic phase to a ferromagnetic phase, thereby producing a magnetic pulse; and using the magnetic pulse to affect the magnetization of the storage medium.

16. The method of claim 15, wherein the phase transition material comprises FeRh or FeRhX, wherein X is selected from the group of Pd, Pt, Ir, Ru, Re or Os.

17. The method of claim 15, wherein the phase transition material comprises a rare earth/transition metal alloy.

18. The method of claim 15, wherein the step of heating the phase transition material comprises:

directing an electromagnetic wave onto the phase transition material.

19. The method of claim 15, wherein the step of applying a magnetic bias field to the phase transition material comprises:

passing an electric current through a conductor to apply the magnetic bias field to the phase transition material.

20. A recording head for use with a data in a storage medium, the recording head comprising:

a write pole including a phase transition material, wherein the phase transition material is divided into two sections;

a return pole magnetically coupled to the write pole;

a magnetic field source for applying a magnetic bias field to the phase transition material; and a heat source for heating the phase transition material to cause the phase transition material to change from an antiferromagnetic phase to a ferromagnetic phase, thereby producing a magnetic pulse that can affect the magnetization of the storage medium, wherein the magnetic pulse is produced between the two sections.

21. The recording head of claim 20, wherein heat source comprises:

a source of an electromagnetic radiation; and a waveguide for directing the electromagnetic radiation onto the phase transition material.

22. The recording head of claim 20, wherein the phase transition material comprises FeRh or FeRhX, wherein X is selected from the group of Pd, Pt, Ir, Ru, Re or Os.

23. The recording head of claim 20, wherein the phase transition material comprises a rare earth/transition metal alloy.

* * * * *

UNITED STATES PATENT AND TRADEMARK OFFICE
CERTIFICATE OF CORRECTION

PATENT NO. : 7,271,981 B2  Page 1 of 1
APPLICATION NO. : 10/718430
DATED : September 18, 2007
INVENTOR(S) : Ganping Ju et al.

It is certified that error appears in the above-identified patent and that said Letters Patent is hereby corrected as shown below:

Cover Page
Other Publications
"Allow" should read -- Alloy --

Column 7, Line 8 (Claim 13)
"Jr." should read -- Ir, --

Signed and Sealed this

First Day of April, 2008

JON W. DUDAS
*Director of the United States Patent and Trademark Office*